US012713945B2

(12) United States Patent
Kim

(10) Patent No.: US 12,713,945 B2
(45) Date of Patent: Aug. 18, 2026

(54) WIRING SUBSTRATE AND SEMICONDUCTOR PACKAGE INCLUDING THE SAME

(71) Applicant: SAMSUNG ELECTRONICS CO., LTD., Suwon-si (KR)

(72) Inventor: Youngbae Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 302 days.

(21) Appl. No.: 18/420,135

(22) Filed: Jan. 23, 2024

(65) Prior Publication Data

US 2025/0006648 A1 Jan. 2, 2025

(30) Foreign Application Priority Data

Jun. 29, 2023 (KR) ........................ 10-2023-0084049

(51) Int. Cl.

*H10W 70/60* (2026.01)
*H10W 40/25* (2026.01)
*H10W 70/05* (2026.01)
*H10W 70/65* (2026.01)
*H10W 90/00* (2026.01)

(Continued)

(52) U.S. Cl.

CPC ........ *H10W 70/611* (2026.01); *H10W 40/255* (2026.01); *H10W 70/05* (2026.01); *H10W 70/65* (2026.01); *H10W 90/401* (2026.01); *H10B 80/00* (2023.02); *H10W 74/15* (2026.01); *H10W 90/00* (2026.01); *H10W 90/297* (2026.01); *H10W 90/722* (2026.01); *H10W 90/724* (2026.01); *H10W 90/732* (2026.01); *H10W 90/734* (2026.01)

(58) Field of Classification Search

None

See application file for complete search history.

(56) References Cited

U.S. PATENT DOCUMENTS 9,906,312 B2 2/2018 Kim
10,727,048 B2 7/2020 Tsunetomo et al.

(Continued)

FOREIGN PATENT DOCUMENTS

| | | |
|---|---|---|
| JP | 2009218498 | 9/2009 |
| JP | 6489660 | 3/2019 |
| KR | 10-2024-0175634 | 12/2024 |

*Primary Examiner* — Kyoung Lee

(74) *Attorney, Agent, or Firm* — Morgan, Lewis & Bockius LLP

(57) ABSTRACT

A wiring substrate may include a core portion, an upper peripheral portion on a top surface of the core portion, and a lower peripheral portion on a bottom surface of the core portion. The upper peripheral portion may include a bridge chip provided on the top surface of the core portion, upper insulating patterns provided on the top surface of the core portion to cover the bridge chip, and upper interconnection patterns in the upper insulating patterns. The lower peripheral portion may include a dummy structure on the bottom surface of the core portion, lower insulating patterns on the bottom surface of the core portion to cover the dummy structure, and lower interconnection patterns in the lower insulating patterns. A mean thermal expansion coefficient of the upper peripheral portion may be substantially equal to a mean thermal expansion coefficient of the lower peripheral portion.

20 Claims, 7 Drawing Sheets

(51) Int. Cl.

| | |
|---|---|
| *H10B 80/00* | (2023.01) |
| *H10W 74/15* | (2026.01) |
| *H10W 90/20* | (2026.01) |

(56) References Cited

U.S. PATENT DOCUMENTS

| | | | | |
|---|---|---|---|---|
| 11,605,594 | B2 | 3/2023 | Lane et al. | |
| 2022/0189880 | A1* | 6/2022 | Pietambaram ...... | H10W 70/611 |
| 2022/0199482 | A1 | 6/2022 | Chiu et al. | |
| 2024/0421093 | A1* | 12/2024 | Kim .................... | H10W 70/611 |

* cited by examiner 100
134p2
300
324p2
302
322
324
320
324p1
310
202
200
A
CA
SA2
SA1
150
134p1
134
132
112
110
122
124
124p
130
120

WIRING SUBSTRATE AND SEMICONDUCTOR PACKAGE INCLUDING THE SAME

CROSS-REFERENCE TO RELATED APPLICATIONS

This U.S. non-provisional patent application claims priority under 35 U.S.C. § 119 to Korean Patent Application No. 10-2023-0084049, filed on Jun. 29, 2023, in the Korean Intellectual Property Office, the entire contents of which are hereby incorporated by reference.

BACKGROUND OF THE INVENTION

The present disclosure relates to a wiring substrate and a semiconductor package including the same.

In light of recent advancements in the electronics industry, the demand for high-performance, high-speed, and compact electronic components has been steadily increasing. As a result, there is a development of packaging technologies that allow for the mounting of multiple semiconductor chips within a single package.

Recently, a demand for portable electronic devices also has been rapidly increasing in the market, and thus, the reduction in sizes and weights of electronic components constituting the portable electronic devices has been pursued. For this, packaging technologies for reducing a size and a weight of each component and of integrating a plurality of individual components in a single package has been sought.

SUMMARY

Principles and embodiments of the present inventive concept provide a wiring substrate, which is configured to suppress a warpage issue caused by a difference in thermal expansion coefficient between upper and lower portions thereof, and thereby to have improved structural stability, and a method of fabricating a semiconductor package including the same.

According to an embodiment of the inventive concept, a wiring substrate may include a core portion, an upper peripheral portion provided on a top surface of the core portion, and a lower peripheral portion provided on a bottom surface of the core portion. The core portion may include a penetration via vertically penetrating the core portion and electrically connecting the upper peripheral portion to the lower peripheral portion. The upper peripheral portion may include a bridge chip provided on the top surface of the core portion, upper insulating patterns provided on the top surface of the core portion and covering the bridge chip, and upper interconnection patterns in the upper insulating patterns. The lower peripheral portion may include a dummy structure provided on the bottom surface of the core portion, lower insulating patterns provided on the bottom surface of the core portion and covering the dummy structure, and lower interconnection patterns in the lower insulating patterns. A mean thermal expansion coefficient of the upper peripheral portion may be substantially equal to a mean thermal expansion coefficient of the lower peripheral portion.

According to an embodiment of the inventive concept, a wiring substrate may include a first redistribution layer, a second redistribution layer provided on the first redistribution layer, a core portion disposed between the first redistribution layer and the second redistribution layer, the core portion including a center region and peripheral regions enclosing the center region, a dummy chip provided on the center region of the core portion and in the first redistribution layer, and a bridge chip provided on the center region of the core portion and in the second redistribution layer. A thermal expansion coefficient of the dummy chip may be between 0.9 and 1.1 times a thermal expansion coefficient of the bridge chip.

According to an embodiment of the inventive concept, a semiconductor package may include a package substrate, a first semiconductor chip on the package substrate, a chip stack provided on the package substrate, wherein the chip stack is laterally spaced apart from the first semiconductor chip, wherein the chip stack comprising a plurality of second semiconductor chips that are vertically stacked, and a mold layer provided on the substrate to enclose the first semiconductor chip and the chip stack. The package substrate may include a core portion, a bridge chip provided on a top surface of the core portion, an upper peripheral portion covering the top surface of the core portion and the bridge chip, a dummy structure provided on a bottom surface of the core portion; and a lower peripheral portion covering the bottom surface of the core portion and the dummy structure. A material of the bridge chip is substantially the same as a material of the dummy structure, and the bridge chip and the dummy structure overlap each other.

BRIEF DESCRIPTION OF THE DRAWINGS

FIGS. 6 to 8 are sectional views illustrating a method of fabricating a wiring substrate, according to an embodiment of the inventive concept.

DETAILED DESCRIPTION

Various embodiments of the inventive concepts will now be described more fully with reference to the accompanying drawings, in which example embodiments are shown.

Figure 1:
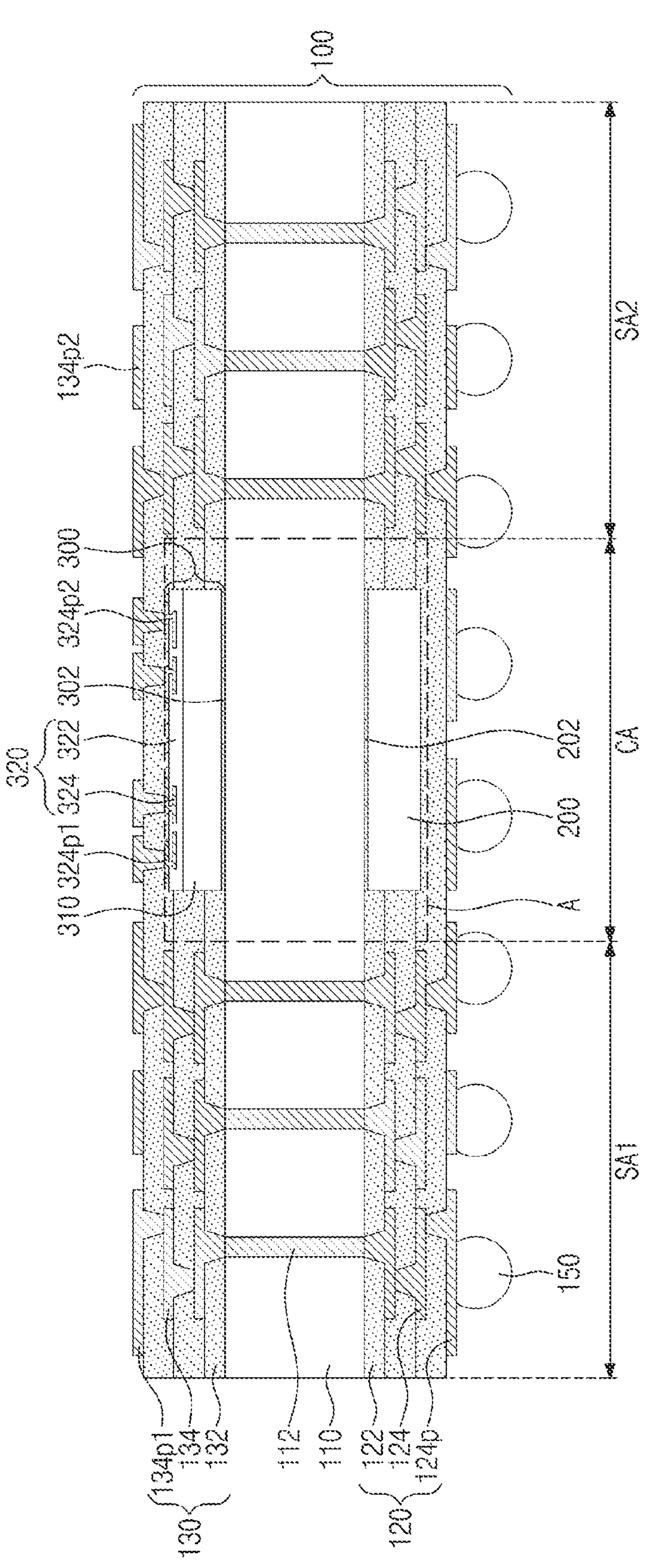
FIG. 1 is a sectional view illustrating a wiring substrate, according to an embodiment of the inventive concept.

FIG. 1 is a sectional view illustrating a semiconductor package according to an embodiment of the inventive concept.

Figure 2:
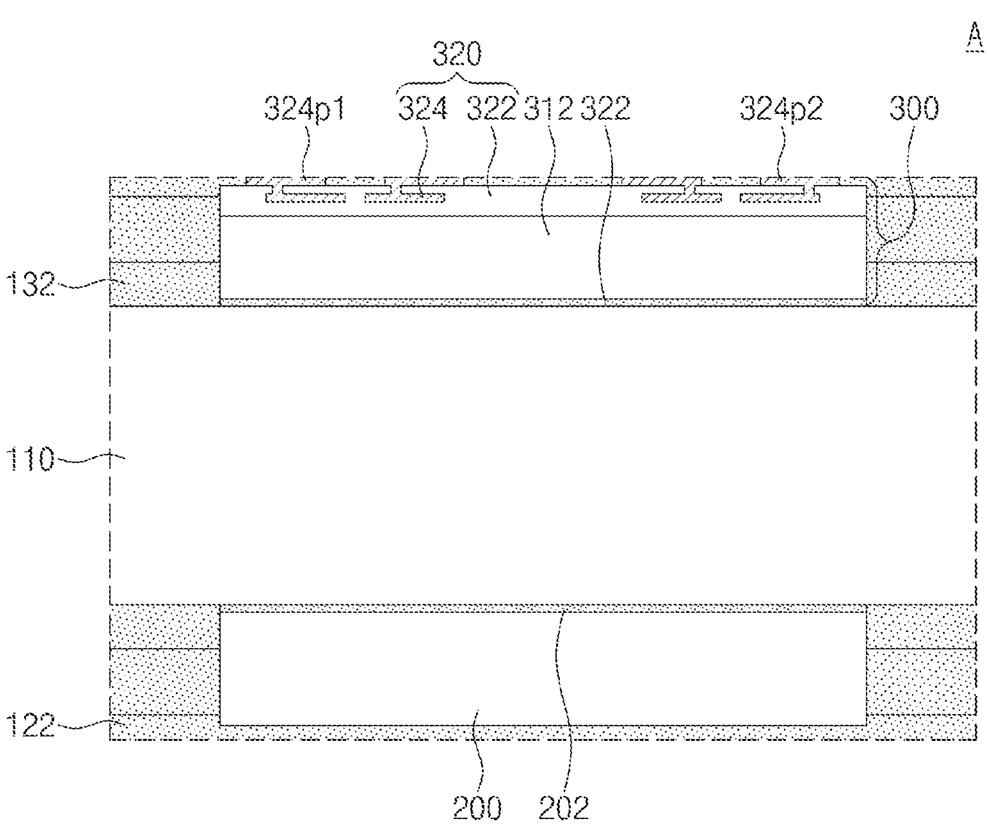
FIGS. 2 and 3 are enlarged sectional views illustrating a portion A of FIG. 1.
Figure 3:
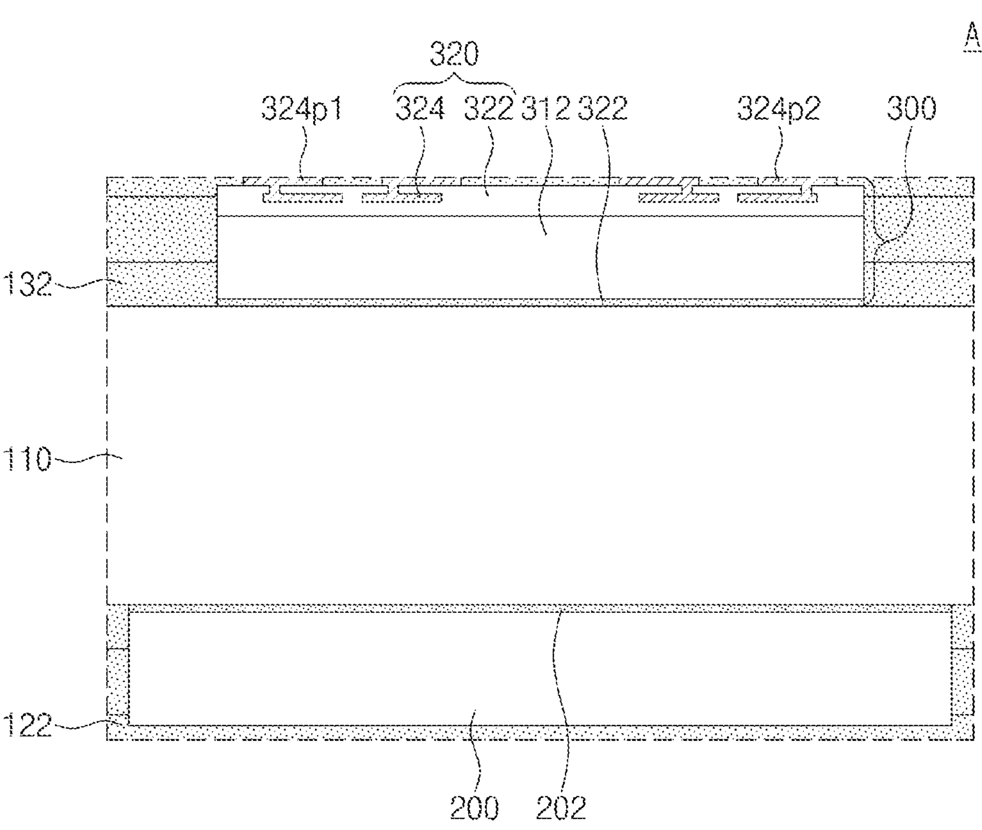

FIGS. 2 and 3 are enlarged sectional views illustrating a wiring substrate according to an embodiment of the inventive concept and corresponding to a portion 'A' of FIG. 1.

Referring to FIGS. 1 and 2, a wiring substrate 100 may be provided, where the wiring substrate 100 may include a plurality of layers. The wiring substrate 100 may include a core portion 110, a lower peripheral portion 120 provided on a bottom surface of the core portion 110, and an upper peripheral portion 130 provided on a top surface of the core portion 110.

In various embodiments, the core portion 110 may be a plate-shaped structure (e.g., a rectangular prism). In various embodiments, the core portion 110 may include a single core pattern, when viewed in a plan view. According to an embodiment of the inventive concept, the core portion 110 is illustrated to have one core pattern, but the inventive concept is not limited thereto. The core portion 110 may include two or more core patterns, where for example, the wiring substrate 100 may include a plurality of core patterns, which are spaced apart from each other when viewed in a plan view. The core portion 110 may include a center region CA and peripheral regions SA1 and SA2, where peripheral regions SA1 and SA2 may adjoin the center region CA. The center region CA may be a portion of the core portion 110 to which a dummy structure 200 and a bridge chip 300 can be attached. The core portion 110 may include an insulating material, where for example, the core portion 110 may be formed of or include glass.

In various embodiments, the core portion 110 may include a core penetration via 112, which is provided to vertically penetrate the same. For example, the core penetration vias 112 may be provided to penetrate the peripheral regions SA1 and SA2 of the core portion 110, where the core penetration via 112 may be extended from the top surface of the core portion 110 to the bottom surface of the core portion 110. The core penetration via 112 may be exposed to the outside of the core portion 110 near the top and bottom surfaces of the core portion 110. The core penetration via 112 may be used to electrically connect the lower and upper peripheral portions 120 and 130 to each other. The core penetration via 112 may include a conductive material, where for example, the core penetration via 112 may be formed of or include a metal material (e.g., copper (Cu)). In an embodiment, a plurality of core penetration vias 112 may be provided.

In various embodiments, the lower peripheral portion 120 may be provided on the bottom surface of the core portion 110, where the lower peripheral portion 120 may cover the bottom surface of the core portion 110. The lower peripheral portion 120 may serve as a redistribution layer for the redistribution of the wiring substrate 100. The lower peripheral portion 120 may include one or more lower interconnection layers, which are sequentially stacked on the bottom surface of the core portion 110. Each of the lower interconnection layers may include a lower insulating pattern 122 and a lower interconnection pattern 124. The lower interconnection patterns 124, which are included in adjacent ones of the lower interconnection layers, may be electrically connected to each other. The lower insulating pattern 122 and the lower interconnection pattern 124 can form one of the lower interconnection layers.

In various embodiments, the lower insulating pattern 122 may be formed of or include at least one of insulating polymers or photo-imageable polymers (PIDs). For example, the PID materials may include photo-imageable polyimides, polybenzoxazole (PBO), phenol-based polymers, and benzocyclobutene-based polymers.

In various embodiments, the lower interconnection pattern 124 may be provided on the lower insulating pattern 122, where for example, the lower interconnection pattern 124 may be provided on a bottom surface of the lower insulating pattern 122. The lower interconnection pattern 124 may include a protruding portion that is extended to a region under the bottom surface of the lower insulating pattern 122. The lower interconnection pattern 124 may extend laterally (e.g., horizontally) along the bottom surface of the lower insulating pattern 122. The lower interconnection pattern 124 may be covered with another lower insulating pattern 122, which is disposed below the bottom surface of the lower insulating pattern 122. The lower interconnection pattern 124 may serve as a pad or wire portion of the lower interconnection layer. The lower interconnection pattern 124 may include a conductive material, where for example, the lower interconnection pattern 124 may be formed of or include copper (Cu).

In various embodiments, the lower interconnection pattern 124 may have a damascene structure. The lower interconnection pattern 124 may include a via portion, which is extended upward from the top surface thereof. The via portion may be used to electrically connect the lower interconnection patterns 124 vertically to each other. For example, the via portion may be extended from the top surface of the lower interconnection pattern 124 to penetrate the lower insulating pattern 122, and may be connected to a bottom surface of the lower interconnection pattern 124 of another lower interconnection layer thereon. In other words, a lower portion of the lower interconnection pattern 124, which is placed below the lower insulating pattern 122, may be a head portion, which is used as a horizontal wire or a pad, and the via portion of the lower interconnection pattern 124 may be a tail portion. The lower interconnection pattern 124 may have an inverted shape of the letter 'T'.

In various embodiments, an outer terminal 150 may be provided below the lower peripheral portion 120. The outer terminal 150 may be disposed on a lower pad 124*p*, which is provided on a bottom surface of the lower peripheral portion 120. The lower pad 124*p* may be a portion of the lower interconnection pattern 124, which is exposed to the outside of the lower peripheral portion 120 near the bottom surface of the lower peripheral portion 120. The lower pad 124*p* may be an additional pad, which is disposed on the lower insulating pattern 122 of the lower peripheral portion 120, and is electrically connected to the lower interconnection pattern 124. The outer terminal 150 may include a solder ball or a solder bump. In an embodiment, a plurality of lower pads 124*p* and a plurality of outer terminals 150 may be provided.

In various embodiments, the dummy structure 200 may be provided in the wiring substrate 100. The dummy structure 200 may be used as an element that can prevent warpage in the wiring substrate 100, and may be provided in the form of a dummy chip placed in the wiring substrate 100. The dummy structure 200 may be provided on the bottom surface of the core portion 110, where the dummy structure 200 may be provided as a portion of the lower peripheral portion 120. The lower peripheral portion 120 and the dummy structure 200 may be two distinct elements, where the dummy structure 200 may be placed in the lower peripheral portion 120 and may be covered with the lower insulating pattern 122. A thickness of the dummy structure 200 may be greater than a thickness of one or more of the lower interconnection layers. The dummy structure 200 may be provided on the center region CA of the core portion 110. The dummy structure 200 may be electrically disconnected from the lower interconnection pattern 124. The dummy structure 200 may be separated from the lower interconnection pattern 124 in the lower insulating pattern 122, and may be in an electrically-floated state.

In various embodiments, a first adhesive layer 202 may be interposed between a top surface of the dummy structure 200 and the bottom surface of the core portion 110. The dummy structure 200 may be attached to the bottom surface of the core portion 110 using the first adhesive layer 202. The first adhesive layer 202 may include a die attach adhesive (DAA).

In various embodiments, the dummy structure 200 may be buried in the lower peripheral portion 120. For example, at least a portion of a lower interconnection layer of the lower peripheral portion 120 may cover the dummy structure 200.

In various embodiments, the upper peripheral portion 130 may be provided on the top surface of the core portion 110, where the upper peripheral portion 130 may cover the top surface of the core portion 110. The upper peripheral portion 130 may include one or more upper interconnection layers, which are sequentially stacked on the top surface of the core portion 110. Each of the upper interconnection layers may include an upper insulating pattern 132 and an upper interconnection pattern 134. The upper interconnection patterns 134, which are included in adjacent ones of the upper interconnection layers, may be electrically connected to each other. The upper insulating pattern 132 and the upper interconnection pattern 134 can form one of the upper interconnection layers.

In various embodiments, the upper insulating pattern 132 may be formed of or include at least one of insulating polymers or photo-imageable polymers (PIDs). For example, the photoimageable polymers may include at least one of photoimageable polyimide (PI), polybenzoxazole (PBO), phenol-based polymers, or benzocyclobutene-based polymers.

In various embodiments, the upper interconnection pattern 134 may be provided on the upper insulating pattern 132, where the upper interconnection pattern 134 may be provided on a top surface of the upper insulating pattern 132. The upper interconnection pattern 134 may include a protruding portion that is extended to a region on the top surface of the upper insulating pattern 132. The upper interconnection pattern 134 may extend laterally (e.g., horizontally) along the top surface of the upper insulating pattern 132. The upper interconnection pattern 134 on the top surface of the upper insulating pattern 132 may be covered with another upper insulating pattern 132 thereon. The upper interconnection pattern 134 may serve as a pad or wire portion of the upper interconnection layer. The upper interconnection pattern 134 may include a conductive material, where for example, the upper interconnection pattern 134 may be formed of or include copper (Cu).

In various embodiments, first and second upper pads **134*p*1 and 134*p*2 may be provided on a top surface of the upper peripheral portion 130. The first and second upper pads 134*p*1 and 134*p*2 may be portions of the upper interconnection pattern 134, which are not covered by the upper insulating pattern 132 of the upper peripheral portion 130, or additional pads, which are disposed on the upper insulating pattern 132 of the upper peripheral portion 130 and are connected to the upper interconnection pattern 134. The first and second upper pads 134*p*1 and 134*p*2 may include a conductive material, where for example, the first and second upper pads 134*p*1 and 134*p*2** may be formed of or include copper (Cu).

In various embodiments, the upper interconnection pattern 134 may have a damascene structure. The upper interconnection pattern 134 may include a via portion, which is extended downward from a bottom surface thereof. The via portion may be used to electrically connect the upper interconnection patterns 134, vertically to each other. For example, the via portion may be extended from a bottom surface of the upper interconnection pattern 134 to penetrate the upper insulating pattern 132 and may be connected to a top surface of the upper interconnection pattern 134 of another upper interconnection layer thereunder. An upper portion of the upper interconnection pattern 134, which is placed on the upper insulating pattern 132, may be a head portion, which is used as a horizontal wire or a pad, and the via portion of the upper interconnection pattern 134 may be a tail portion. The via portion of the upper interconnection pattern 134 may be electrically connected to the via portion of the lower interconnection pattern 124 through the core penetration via 112. The upper interconnection pattern 134 may have a shape of the letter ‘T’.

In various embodiments, the bridge chip 300 may be provided in the wiring substrate 100. The bridge chip 300 may be provided on the top surface of the core portion 110. Although the bridge chip 300 may be provided as a portion of the upper peripheral portion 130, the upper peripheral portion 130 and the bridge chip 300 may be two distinct elements. The bridge chip 300 may be provided on the center region CA of the core portion 110. The penetration via 112 may be shifted from the bridge chip 300 in a direction parallel to the top surface of the core portion 110. The bridge chip 300 may be placed in the upper peripheral portion 130 and may be covered with the upper insulating pattern 132. A thickness of the bridge chip 300 may be greater than a thickness of one or more of the upper interconnection layers.

In various embodiments, the bridge chip 300 may have a front surface and a rear surface with a thickness therebetween. The front surface may be defined as a surface of a semiconductor chip, which is an active surface for integrated devices, and on which interconnection wires or pads are formed. The rear surface may be defined as a surface that is opposite to the front surface of the semiconductor chip. The bridge chip 300 may be placed on the core portion 110, where the rear surface of the bridge chip 300 faces the top surface of the core portion 110. The bridge chip 300 may be provided on the core portion 110 in a face-up manner. The bridge chip 300 may be attached to the core portion 110 using a second adhesive layer 302, where for example, the second adhesive layer 302 may be interposed between a bottom (rear) surface of the bridge chip 300 and the top surface of the core portion 110. The second adhesive layer 302 may include a die attach adhesive (DAA). The bridge chip 300 may include a bridge substrate 310 and a bridge circuit layer 320.

In various embodiments, the bridge substrate 310 may include a semiconductor substrate. For example, the bridge substrate may be a semiconductor substrate, such as a semiconductor wafer. The bridge substrate 310 may be a silicon substrate, a silicon-on-insulator (SOI) substrate, a germanium (Ge) substrate, a germanium-on-insulator (GOI) substrate, a silicon-germanium (SiGe) substrate, a group III-V semiconductor substrate, or a substrate including an epitaxial film formed by a selective epitaxial growth (SEG) process. The bridge substrate 310 may be formed of or include at least one of silicon (Si), germanium (Ge), silicon-germanium (SiGe), gallium arsenic (GaAs), indium gallium arsenic (InGaAs), or aluminum gallium arsenic (AlGaAs).

In various embodiments, the bridge circuit layer 320 may be provided on a top surface of the bridge substrate 310, where the bridge circuit layer 320 may include a bridge insulating pattern 322 and a bridge interconnection pattern 324, which are formed on the top surface of the bridge substrate 310. In an embodiment, the bridge circuit layer 320 may further include a circuit pattern or a protection layer.

In various embodiments, the bridge insulating pattern 322 may include an insulating material. The bridge insulating pattern 322 may include at least one of silicon oxide (SiO), silicon nitride (SiN), silicon oxynitride (SiON), silicon carbonitride (SiCN), or insulating polymers. The bridge insulating pattern 322 may be formed of or include at least one of insulating polymers or photo-imageable polymers (PIDs). For example, the photoimageable polymers may include at least one of photoimageable polyimide (PI), polybenzoxazole (PBO), phenol-based polymers, or benzocyclobutene-based polymers.

In various embodiments, the bridge interconnection pattern 324 may be provided in the bridge insulating pattern 322. The bridge interconnection pattern 324 may be configured to electrically connect various semiconductor devices, which are mounted on the core portion 110, to each other. The bridge interconnection pattern 324 may include a conductive material, where for example, the bridge interconnection pattern 324 may be formed of or include at least one of copper (Cu) or aluminum (Al).

FIG. 1 illustrates an example, in which the bridge insulating pattern 322 is a single layer, but the inventive concept is not limited thereto. In an embodiment, the bridge insulating pattern 322 may include a plurality of insulating layers, and the bridge interconnection pattern 324 may be provided in the insulating layers.

In various embodiments, a first bridge pad **324*p*1 and a second bridge pad 324*p*2 may be provided on the top surface of the bridge chip 300. The first and second bridge pads 324*p*1 and 324*p*2 may be disposed on a top surface of the bridge circuit layer 320. The first and second bridge pads 324*p*1 and 324*p*2 may have protruding portions that extend above the top surface of the bridge chip 300. The first and second bridge pads 324*p*1 and 324*p*2 may be portions of the bridge interconnection pattern 324 provided in the bridge insulating pattern 322, where the first and second bridge pads 324*p*1 and 324*p*2 may be exposed to the outside of the bridge insulating pattern 322 near the top surface of the bridge insulating pattern 322**.

In various embodiments, the bridge chip 300 may be buried in the upper peripheral portion 130, where for example, at least a portion of the interconnection layer of the upper peripheral portion 130 may cover the bridge chip 300. The bridge interconnection pattern 324 may penetrate the bridge insulating pattern 322 and may be connected to a top surface of the first bridge pad **324*p*1 and a top surface of the second bridge pad 324*p*2. The first and second bridge pads 324*p*1 and 324*p*2 may be located in different regions of the bridge chip 300. As an example, the first bridge pad 324*p*1 may be disposed in a first region, and the second bridge pad 324*p*2 may be disposed in a second region. The first and second bridge pads 324*p*1 and 324*p*2, which are placed in the different regions, may be connected to each other by the bridge interconnection pattern 324. FIG. 1 illustrates a portion of the bridge interconnection pattern 324, and the first bridge pad 324*p*1 may not be electrically disconnected from the second bridge pad 324*p*2 in the bridge circuit layer 320. The first bridge pad 324*p*1 may be electrically connected to the second bridge pad 324*p*2 through the bridge interconnection pattern 324 in the bridge circuit layer 320**.

In various embodiments, a thermal expansion coefficient of the dummy structure 200 may be between 0.9 and 1.1 times that of the bridge chip 300. In various embodiments, the thermal expansion coefficient of the bridge chip 300 may be substantially equal to the thermal expansion coefficient of the dummy structure 200. As an example, the primary materials of the bridge chip 300 and the dummy structure 200 may be the same as each other. A main material of the bridge chip 300 may be substantially the same as a main material of the dummy structure 200, where the main material of the bridge chip 300 refers to the material of the bridge substrate 310, which occupies the largest volume portion within the bridge chip 300. However, in an embodiment, even when the primary materials in the bridge chip 300 and the dummy structure 200 are different from each other, the thermal expansion coefficient of the dummy structure 200 may be between 0.9 and 1.1 times that of the bridge chip 300, where the thermal expansion coefficient represents the rate of change in volume of an object per unit change in temperature (i.e., 1° C.) under the constant pressure condition.

In various embodiments, the bridge chip 300 may have substantially the same shape as the dummy structure 200, where a shape of an object may be used to represent geometrical features (e.g., thickness and planar shape) of the object. As an example, a thickness of the bridge chip 300 may be substantially equal to a thickness of the dummy structure 200, and the bridge chip 300 may have substantially the same planar shape as the dummy structure 200. In an embodiment, a volume of the bridge chip 300 may be substantially equal to a volume of the dummy structure 200. A side surface of the bridge chip 300 and a side surface of the dummy structure 200 may be aligned to each other in a direction perpendicular to the top surface of the core portion 110. The bridge chip 300 and the dummy structure 200 may be disposed in such a way that they face each other, with the core portion 110 interposed therebetween. Alternatively, the bridge chip 300 and the dummy structure 200 may be shifted from each other in a direction parallel to the top surface of the core portion 110. The penetration via 112 may be shifted from the bridge chip 300 in a direction parallel to the top surface of the core portion 110. The primary materials of the bridge chip 300 and the dummy structure 200 may be the same as each other. Accordingly, a thermal expansion coefficient of the bridge chip 300 may be substantially equal to a thermal expansion coefficient of the dummy structure 200. Thus, a mean thermal expansion coefficient of the upper peripheral portion 130 including the bridge chip 300 may be substantially equal to a mean thermal expansion coefficient of the lower peripheral portion 120 including the dummy structure 200.

In an embodiment, referring to FIGS. 1 and 3, the shape of the bridge chip 300 may be different from the shape of the dummy structure 200. Furthermore, the thickness of the bridge chip 300 may be different from the thickness of the dummy structure 200. When viewed in a plan view, the entirety of the bridge chip 300 may vertically overlap the dummy structure 200. The bridge chip 300 may include at least two portions, one of which is vertically overlapped with the dummy structure 200, and the other of which is not overlapped with the dummy structure 200. In various embodiments, the bridge chip 300 and the dummy structure 200 may be laterally spaced apart, such that the bridge chip 300 and the dummy structure 200 do not share an overlapping area therebetween. The volume of the bridge chip 300 and the volume of the dummy structure 200 may be different from each other. In this case, even when the main materials of the bridge chip 300 and the dummy structure 200 are the same as or different from each other, the dummy structure 200 may be configured to have a thermal expansion coefficient that is between 0.9 and 1.1 times that of the bridge chip 300. A mean thermal expansion coefficient of the upper peripheral portion 130 including the bridge chip 300 may be substantially equal to a mean thermal expansion coefficient of the lower peripheral portion 120 including the dummy structure 200.

Referring to FIGS. 1, 2, and 3, the bridge chip 300 may be inserted in the upper peripheral portion 130 of the wiring substrate 100, and the dummy structure 200 may be inserted in the lower peripheral portion 120 of the wiring substrate 100. By providing the dummy structure 200 whose thermal expansion coefficient is between 0.9 and 1.1 times that of the bridge chip 300, it may be possible to remove a substantial difference in the mean thermal expansion coefficient between the upper peripheral portion 130 including the bridge chip 300 and the lower peripheral portion 120 including the dummy structure 200. As a result, it may be possible to reduce or prevent the warpage issue in the wiring substrate 100, which may be caused by a difference in thermal expansion coefficient between the upper and lower portions of the wiring substrate 100 spaced apart from each other with the core portion 110 interposed therebetween, and thereby to improve the structural stability of the wiring substrate 100.

Figure 4:
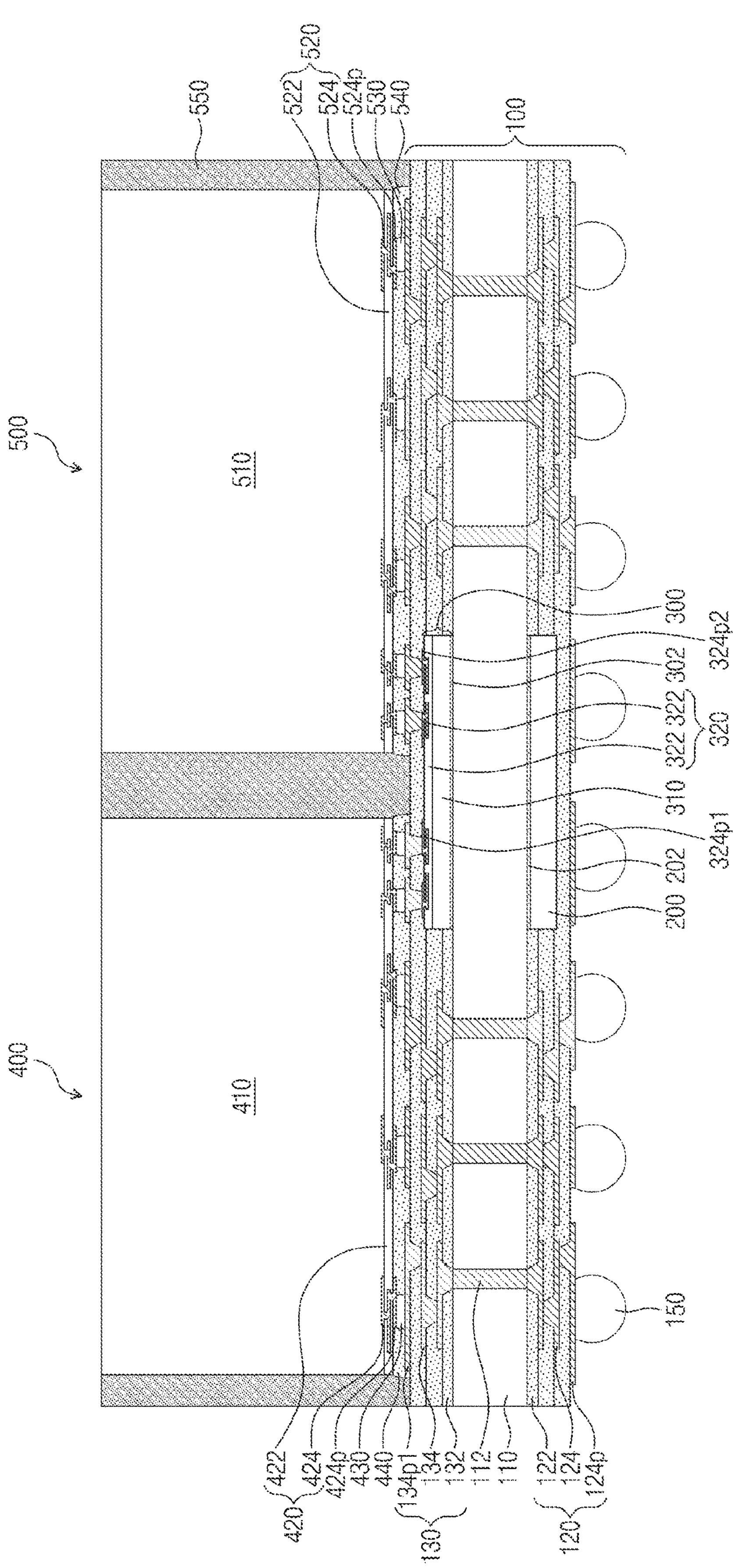
FIGS. 4 and 5 are sectional views illustrating a semiconductor package, according to an embodiment of the inventive concept.

FIG. 4 is a sectional view illustrating a semiconductor package, according to an embodiment of the inventive concept.

Referring to FIG. 4, the wiring substrate 100 may be provided. The wiring substrate 100 may have substantially the same or similar features as the wiring substrate 100 previously described with reference to FIGS. 1 to 3. For example, the wiring substrate 100 may include the core portion 110, the upper peripheral portion 130, the lower peripheral portion 120, and the outer terminals 150, and may further include the bridge chip 300 and the dummy structure 200, which are respectively provided in the upper peripheral portion 130 and the lower peripheral portion 120.

In various embodiments, a first semiconductor chip 400 may be provided on the wiring substrate 100. A bottom surface of the first semiconductor chip 400 may be an active surface, where the bottom surface of the first semiconductor chip 400 may be the front surface. The first semiconductor chip 400 may be provided on the upper peripheral portion 130 in a face-down manner. The first semiconductor chip 400 may include a first semiconductor substrate 410 and a first circuit layer 420.

In various embodiments, the first semiconductor chip 400 may include the first semiconductor substrate 410, where the first semiconductor substrate 410 may include a semiconductor material. As an example, the first semiconductor substrate 410 may be formed of or include silicon (Si). An integrated device or integrated circuits may be formed on a bottom surface of the first semiconductor substrate 410.

In various embodiments, the first circuit layer 420 may be provided on the bottom surface of the first semiconductor substrate 410. The first circuit layer 420 may include a first insulating pattern 422 and a first circuit pattern 424 provided in the first insulating pattern 422. The first insulating pattern 422 may cover the integrated device or the integrated circuits on the bottom surface of the first semiconductor chip 400. The first circuit pattern 424 may be electrically coupled to the integrated device or the integrated circuits formed on the first semiconductor substrate 410. The first circuit layer 420 may include a logic circuit, where for example, the first semiconductor chip 400 may be a logic chip. The first circuit layer 420 may include a memory circuit, where for example, the first semiconductor chip 400 may be a memory chip (e.g., a DRAM, SRAM, MRAM, or FLASH memory chip).

In various embodiments, the first semiconductor chip 400 may be mounted on the upper peripheral portion 130 of the wiring substrate 100. The first semiconductor chip 400 may be physically and electrically coupled to the first upper pads 134*p*1 and the first bridge pads 324*p*1 through first connection terminals 430. The first semiconductor chip 400 may be electrically connected to the upper peripheral portion 130 and the bridge chip 300 through the first connection terminals 430. In an embodiment, first pads 424*p* may be provided on the bottom surface of the first semiconductor chip 400, and the first connection terminals 430 may be provided between the first upper pads 134*p*1 and the first pads 424*p* and between the first bridge pads 324*p*1 and the first pads 424*p*. The first pad 424*p* may be a portion of the first circuit pattern 424, which is exposed from the first insulating pattern 422 of the first circuit layer 420, or an additional pad, which is placed on the first insulating pattern 422 of the first circuit layer 420 and is electrically connected to the first circuit pattern 424. Because the first semiconductor chip 400 is mounted on the upper peripheral portion 130 using the first connection terminals 430, the bottom surface of the first semiconductor chip 400 may be spaced apart from the upper peripheral portion 130.

In various embodiments, a first under-fill layer 440 may be provided between the top surface of the upper peripheral portion 130 and the bottom surface of the first semiconductor chip 400. The first under-fill layer 440 may fill a space between the upper peripheral portion 130 and the first semiconductor chip 400 and may enclose the first upper pads 134*p*1, the first pads 424*p*, the first bridge pads 324*p*1, and the first connection terminals 430.

In an embodiment, a first semiconductor package may be mounted on the upper peripheral portion 130 in place of the first semiconductor chip 400. For example, the first semiconductor package may include a first substrate and a plurality of semiconductor chips, which are provided on the first substrate.

In various embodiments, a second semiconductor chip 500 may be provided on the wiring substrate 100, where the second semiconductor chip 500 may be laterally (e.g., horizontally) spaced apart from the first semiconductor chip 400. The second semiconductor chip 500 may include a second semiconductor substrate 510 and a second circuit layer 520.

In various embodiments, the second semiconductor substrate 510 may include a semiconductor material, where the second semiconductor substrate 510 may include silicon (Si). An integrated device or integrated circuits may be formed on a bottom surface of the second semiconductor substrate 510.

In various embodiments, the second circuit layer 520 may be provided on the bottom surface of the second semiconductor substrate 510. The second circuit layer 520 may include a second insulating pattern 522 and a second circuit pattern 524, which may be provided in the second insulating pattern 522. The second insulating pattern 522 may cover the integrated device or the integrated circuits on the bottom surface of the second semiconductor chip 500. The second circuit pattern 524 may be electrically coupled to the integrated device or the integrated circuits formed on the second semiconductor substrate 510. The second circuit layer 520 may include a memory circuit, where for example, the second semiconductor chip 500 may be a memory chip (e.g., a DRAM, SRAM, MRAM, or FLASH memory chip).

In various embodiments, the second semiconductor chip 500 may be mounted on the upper peripheral portion 130. For example, the second semiconductor chip 500 may be physically and electrically coupled to the second upper pads 134*p*2 and the second bridge pads 324*p*2 through second connection terminals 530. The second semiconductor chip 500 may be electrically connected to the upper peripheral portion 130 and the bridge chip 300 through the second connection terminals 530. The second pad 524*p* may be a portion of the second circuit pattern 524, which is exposed from the second insulating pattern 522 of the second circuit layer 520, or an additional pad, which is placed on the second insulating pattern 522 of the second circuit layer 520 and is electrically connected to the second circuit pattern 524. Because the second semiconductor chip 500 is mounted on the upper peripheral portion 130 using the second connection terminals 530, the bottom surface of the second semiconductor chip 500 may be spaced apart from the upper peripheral portion 130.

In various embodiments, a second under-fill layer 540 may be provided between the top surface of the upper peripheral portion 130 and the bottom surface of the second semiconductor chip 500. The second under-fill layer 540 may fill a space between the upper peripheral portion 130 and the second semiconductor chip 500 and may enclose the second upper pads 134*p*2, the second pads 524*p*, the second bridge pads 324*p*2, and the second connection terminals 530.

In various embodiments, a first mold layer 550 may be provided on the top surface of the upper peripheral portion 130. The first mold layer 550 may enclose the first semiconductor chip 400, the second semiconductor chip 500, the first under-fill layer 440, and the second under-fill layer 540. The first mold layer 550 may cover the sidewalls of the first semiconductor substrate 410 and the second semiconductor substrate 510. A top surface of the first mold layer 550 may be coplanar with a top surface of the first semiconductor chip 400 and a top surface of the second semiconductor chip 500, and the first and second semiconductor chips 400 and 500 may be exposed to the outside of the first mold layer 550 near the top surface of the first mold layer 550. In various embodiments, the first mold layer 550 may cover the top surface of the first semiconductor chip 400 and the top surface of the second semiconductor chip 500. The first mold layer 550 may include an insulating polymer material. For example, the first mold layer 550 may be formed of or include an epoxy molding compound (EMC).

In an embodiment, a second semiconductor package may be provided on the upper peripheral portion 130 in place of the second semiconductor chip 500. For example, the second semiconductor package may include a second substrate and a plurality of semiconductor chips, which are provided on the second substrate. On the upper peripheral portion 130, the second semiconductor package may be laterally (e.g., horizontally) spaced apart from the first semiconductor package.

Figure 5:
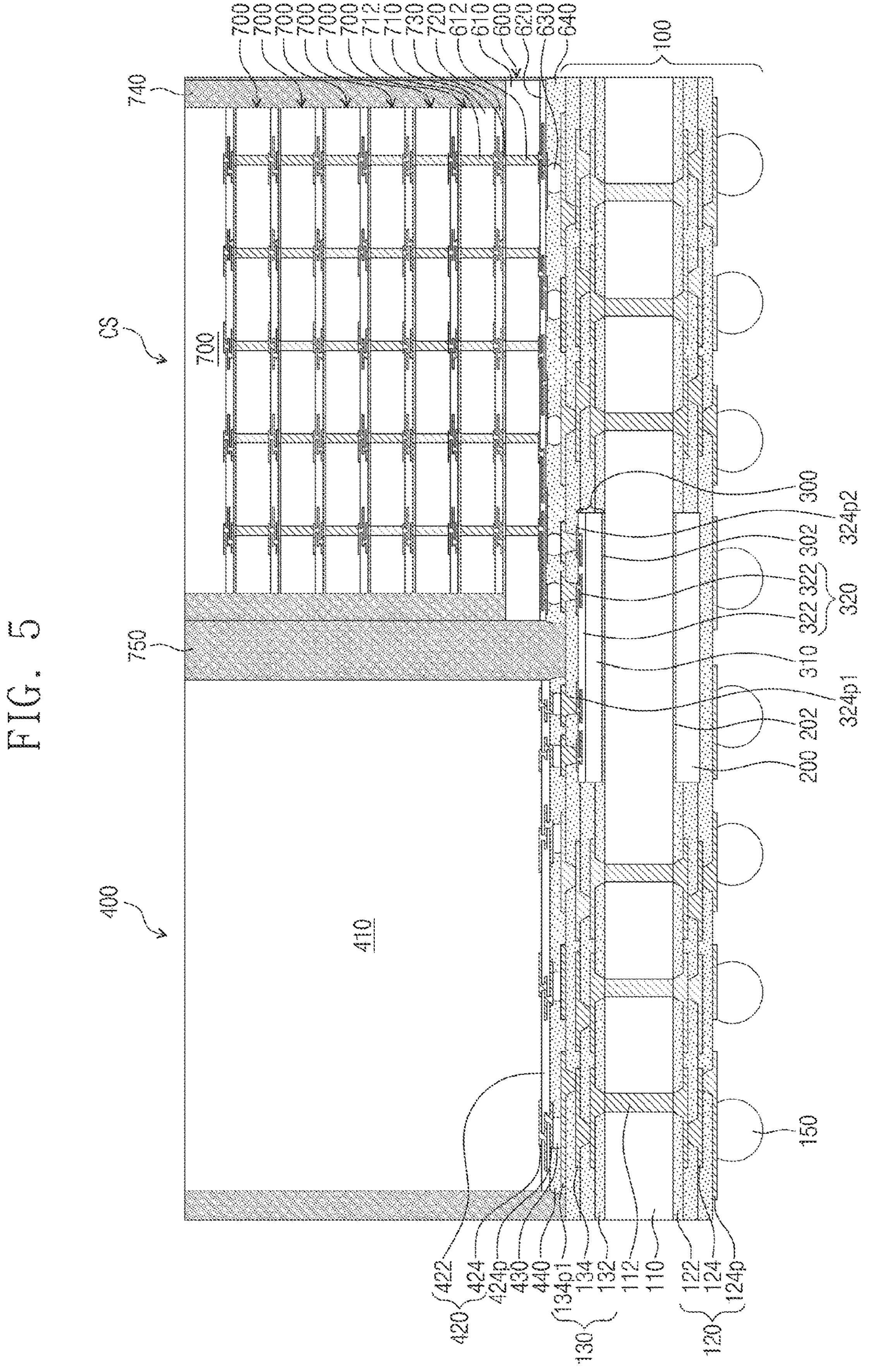

FIG. 5 is a sectional view illustrating a semiconductor package, according to an embodiment of the inventive concept.

Referring to FIG. 5, the wiring substrate 100 may be provided. The wiring substrate 100 may have substantially the same or similar structure as the wiring substrate 100 previously described with reference to FIGS. 1 to 3. For example, the wiring substrate 100 may include the core portion 110, the upper peripheral portion 130, and the lower peripheral portion 120, and may further include the bridge chip 300 and the dummy structure 200, which are respectively provided in the upper peripheral portion 130 and the lower peripheral portion 120.

In various embodiments, the first semiconductor chip 400 may be mounted on the wiring substrate 100. The first semiconductor chip 400 may have substantially the same or similar structure as the first semiconductor chip 400 previously described with reference to FIG. 4.

In various embodiments, a chip stack CS may be provided on the wiring substrate 100. The chip stack CS may be laterally (e.g., horizontally) spaced apart from the first semiconductor chip 400. The chip stack CS may include a base chip 600, one or more third semiconductor chips 700 stacked on the base chip 600, and a second mold layer 740 on the base chip 600 enclosing the third semiconductor chips 700. The base chip 600 may be proximal to the upper peripheral portion 130, and between the third semiconductor chips 700 and the wiring substrate 100. The second mold layer 740 may be on a top surface of the base chip 600 and the sidewalls of the one or more third semiconductor chips 700.

In various embodiments, the base chip 600 may include a base substrate 610, where the base substrate 610 may be a semiconductor substrate. For example, the base substrate 610 may be a wafer-level semiconductor substrate, which is formed of a semiconductor material (e.g., silicon (Si)). A bottom surface of the base chip 600 may be an active surface, where an integrated device or integrated circuits may be formed on the bottom surface of the base substrate 610.

In various embodiments, the base chip 600 may include a base circuit layer 620 and a base penetration via 612. The base circuit layer 620 may be provided on the bottom surface of the base chip 600, where the base circuit layer 620 may include the integrated device or the integrated circuit. For example, the base circuit layer 620 may be a memory circuit. For example, the base chip 600 may be a memory chip (e.g., a DRAM, SRAM, MRAM or FLASH memory chip). The base circuit layer 620 may be a logic circuit, where the base chip 600 may be a logic chip. The base penetration via 612 may be provided to penetrate the base chip 600 in a direction perpendicular to the top surface of the upper peripheral portion 130. The base penetration via 612 and the base circuit layer 620 may be electrically connected to each other.

In various embodiments, the base chip 600 may further include a protection layer and a third connection terminal 630. The protection layer may be disposed on the bottom surface of the base chip 600 to cover the base circuit layer 620. The protection layer may be formed of or include at least one of silicon oxide (SiO) or silicon nitride (SiN). The third connection terminal 630 may be provided on the bottom surface of the base chip 600, where the third connection terminal 630 may be electrically connected to the integrated device or the integrated circuit of the base circuit layer 620. In an embodiment, a plurality of the third connection terminals 630 may be provided.

In various embodiments, the one or more third semiconductor chip 700 may be provided on the base chip 600. A width of the third semiconductor chip 700 may be smaller than a width of the base chip 600, where the width of each chip may be a dimension of the chip measured in a direction parallel to the top surface of the upper peripheral portion 130. The third semiconductor chip(s) 700 may include a third semiconductor substrate 710, a third circuit layer 720, and a penetration via 712. The third semiconductor substrate 710 may be a semiconductor substrate, where the third semiconductor substrate 710 may be formed of or include silicon (Si). The third circuit layer 720, which is disposed on a bottom surface of the third semiconductor substrate 710, may include a memory circuit, where for example, the third semiconductor chip 700 may be a memory chip (e.g., a DRAM, SRAM, MRAM or FLASH memory chip). The penetration via 712 may penetrate the third semiconductor chip 700 in a direction perpendicular to the top surface of the upper peripheral portion 130. The penetration via 712 and the third circuit layer 720 may be electrically connected to each other. A bottom surface of the third semiconductor chip 700 may be an active surface. Connection bumps 730 may be provided on the bottom surface of the third semiconductor chip 700, where the connection bumps 730 can be between the base chip 600 and the third semiconductor chip 700. The connection bumps 730 may electrically connect the base chip 600 to the third semiconductor chip 700.

In an embodiment, a plurality of third semiconductor chips 700 may be provided, where the plurality of third semiconductor chips 700 may be stacked on the base chip 600. In various embodiments, the number of third semiconductor chips 700 may be from 8 to 32. The connection bumps 730 may be provided between each adjacent pair of third semiconductor chips 700, where the uppermost third semiconductor chip 700 (most distant from the base chip 600) may not have the penetration via 712. Furthermore, the uppermost one of the third semiconductor chips 700 may be thicker than the other semiconductor chips 700.

In various embodiments, an adhesive layer may be provided between each of the adjacent pairs of the third semiconductor chips 700. The adhesive layer may include a non-conductive film (NCF). In an embodiment, the adhesive layer may be interposed between the adjacent connection bumps 730 of the third semiconductor chips 700 to prevent an electric short circuit from being formed between two or more of the connection bumps 730.

In various embodiments, a third under-fill layer 640 may be provided between the upper peripheral portion 130 and the chip stack CS, where the third under-fill layer 640 may fill a space between the upper peripheral portion 130 and the base chip 600, and may enclose the second upper pads 134*p*2, the second bridge pads 324*p*2, and the third connection terminals 630.

In various embodiments the second mold layer 740 may be disposed on a top surface of the base chip 600, and the sidewalls of the one or more third semiconductor chips 700. The second mold layer 740 may cover the base chip 600. The second mold layer 740 may enclose the third semiconductor chips 700. A top surface of the second mold layer 740 may be coplanar with a top surface of the uppermost one of the third semiconductor chips 700, where the uppermost one of the third semiconductor chips 700 may be exposed to the outside of the second mold layer 740 near the top surface of the second mold layer 740. The second mold layer 740 may include an insulating polymer material, where for example, the second mold layer 740 may be formed of or include an epoxy molding compound (EMC).

In various embodiments, the chip stack CS may be provided to have the afore-described structure. The chip stack CS may be mounted on the upper peripheral portion 130, where for example, the chip stack CS may be physically and electrically coupled to the second upper pad 134*p*2, which is disposed on the top surface of the upper peripheral portion 130, through the third connection terminal 630 of the base chip 600. The third connection terminal 630 may be provided to be in contact with both a top surface of the second upper pad 134*p*2 and a bottom surface of the base circuit layer 620, where the chip stack CS and the upper peripheral portion 130 may be electrically connected to each other through the third connection terminal 630.

In various embodiments, a third mold layer 750 may be disposed on the top surface of the upper peripheral portion 130, where the third mold layer 750 may enclose the first semiconductor chip 400, the first under-fill layer 440, the chip stack CS, and the third under-fill layer 640. A top surface of the third mold layer 750 may be coplanar with a top surface of the uppermost one of the third semiconductor chips 700 in the chip stack CS and the top surface of the first semiconductor chip 400, and the first and third semiconductor chips 400 and 700 may be exposed to the outside of the third mold layer 750 near the top surface of the third mold layer 750. The third mold layer 750 may cover the sidewalls of the chip stack CS and the first semiconductor chip 400. The third mold layer 750 may include an insulating polymer material, where for example, the third mold layer 750 may be formed of or include an epoxy molding compound (EMC).

Figures 6, 7:
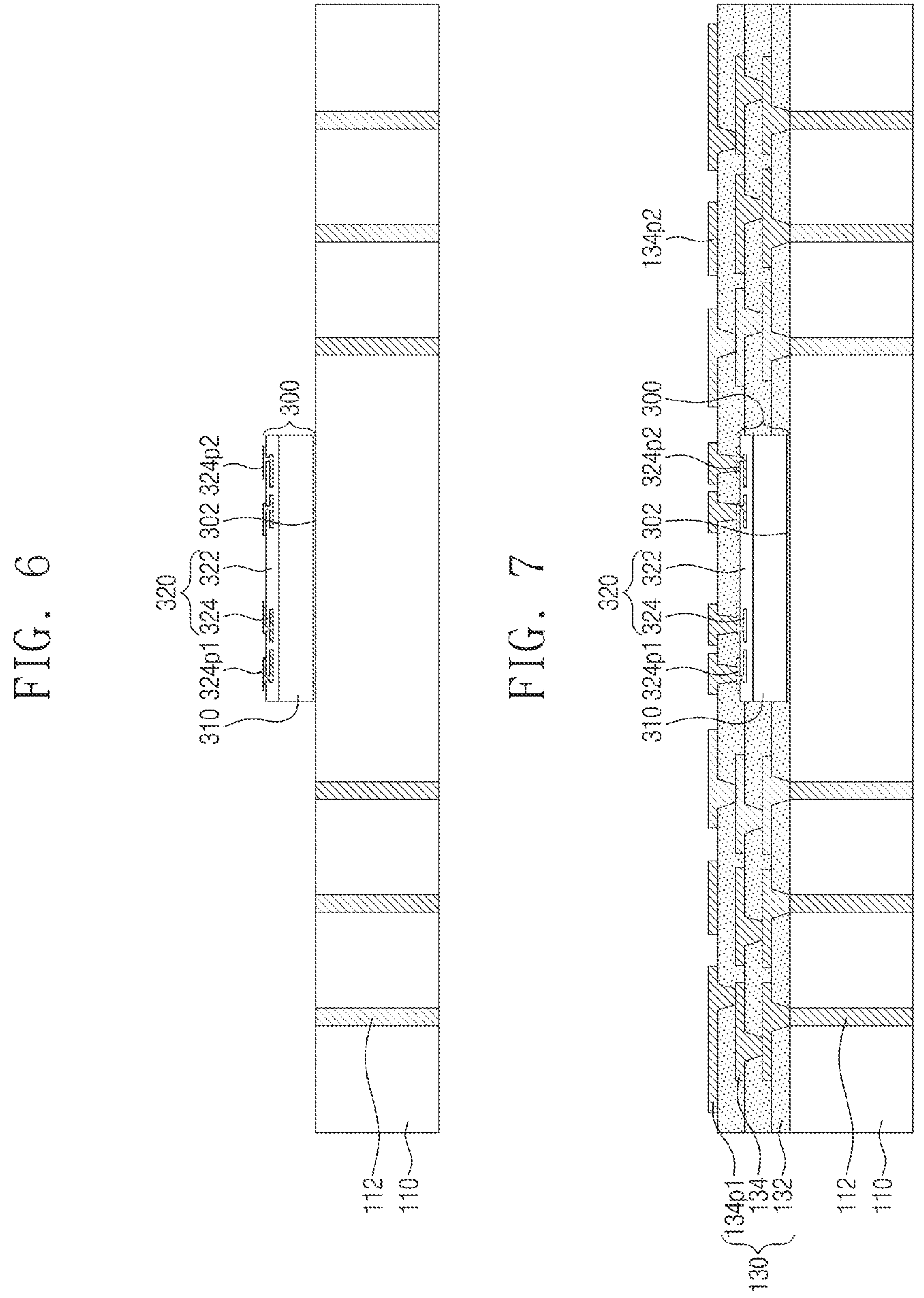
Figure 8:
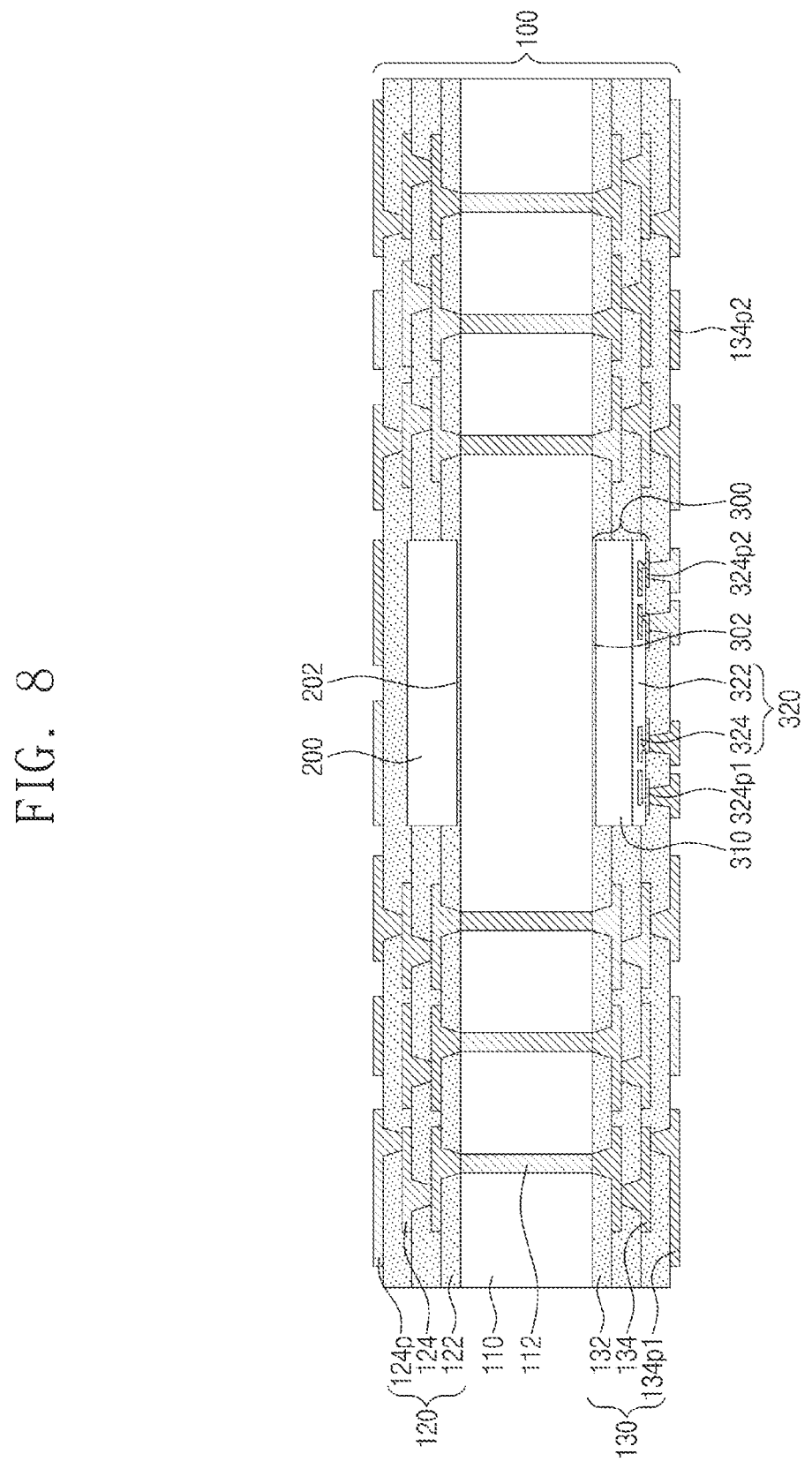

FIGS. 6 to 8 are sectional views illustrating a method of fabricating a wiring substrate according to an embodiment of the inventive concept.

Referring to FIG. 6, the core portion 110 may be provided. Core penetration vias 112 may be formed in the core portion 110, where for example, the core penetration vias 112 may be formed by forming holes through the core portion 110 and filling the holes with a conductive material.

In various embodiments, the bridge chip 300 may be attached to the top surface of the core portion 110. The bridge chip 300 may be formed to have the same or similar features as the bridge chip 300 previously described with reference to FIG. 1. The bridge chip 300 may be attached to the core portion 110 using the second adhesive layer 302, where for example, the second adhesive layer 302 may be attached to the rear surface of the bridge chip 300, and the bridge chip 300 may be attached to the top surface of the core portion 110. The bridge chip 300 may be placed between the core penetration vias 112, where the bridge chip 300 may be located in the center region CA.

Referring to FIG. 7, the upper peripheral portion 130 may be formed on the core portion 110, where the upper peripheral portion 130 may be formed on and around the bridge chip 300. For example, the upper insulating pattern 132 may be formed by forming an insulating layer on the top surface of the core portion 110 and patterning the insulating layer. The upper interconnection pattern 134 may be formed by forming a conductive layer on the upper insulating pattern 132 and patterning the conductive layer. The steps of forming the upper insulating pattern 132 and the upper interconnection pattern 134 may be repeated to form a plurality of upper interconnection layers including the plurality of upper insulating patterns 132 and the plurality of upper interconnection patterns 134. The upper insulating patterns 132 and the upper interconnection patterns 134 may constitute the upper peripheral portion 130 previously described with reference to FIG. 1. The upper peripheral portion 130 may be formed to enclose the bridge chip 300, where the upper peripheral portion 130 may be in contact with side and bottom surfaces of the bridge chip 300. An upper insulating pattern 132 may cover the bridge chip 300.

Referring to FIG. 8, the resulting structure of FIG. 7 may be inverted, such that the upper peripheral portion 130 may be placed below the core portion 110.

In various embodiments, the dummy structure 200 may be attached to the core portion 110. The dummy structure 200 may have substantially the same or similar features as the dummy structure 200 previously described with reference to FIG. 1. The dummy structure 200 may be attached to the core portion 110 using the first adhesive layer 202, where for example, the first adhesive layer 202 may be attached to the bottom surface of the dummy structure 200, and the dummy structure 200 may be attached to the top surface of the core portion 110. The dummy structure 200 may be attached in such a way that it faces the bridge chip 300, with the core portion 110 interposed therebetween. The dummy structure 200 may be placed between the core penetration vias 112, where the dummy structure 200 may be located in the center region CA.

In various embodiments, the lower peripheral portion 120 may be formed on the core portion 110, where for example, the lower insulating pattern 122 may be formed by forming an insulating layer on the top surface of the core portion 110 and patterning the insulating layer. The lower interconnection pattern 124 may be formed by forming a conductive layer on the lower insulating pattern 122 and patterning the conductive layer. The steps of forming the lower insulating pattern 122 and the lower interconnection pattern 124 may be repeated to form a plurality of lower interconnection layers including the plurality of lower insulating patterns 122 and the plurality of lower interconnection patterns 124. The lower insulating patterns 122 and the lower interconnection patterns 124 may constitute the lower peripheral portion 120 previously described with reference to FIG. 1. The lower peripheral portion 120 may be formed to enclose the dummy structure 200, where the lower peripheral portion 120 may be in contact with side and top surfaces of the dummy structure 200. A lower insulating pattern 122 may cover the dummy structure 200.

In various embodiments, the wiring substrate 100 fabricated by the afore-described method may have substantially the same structure as that of FIGS. 6 to 8.

In various embodiments, the heat energy supplied to the wiring substrate 100 during the fabrication process of the wiring substrate 100, may cause the thermal expansion of the wiring substrate 100. In this situation, the wiring substrate 100 may bend either upward or downward. However, according to an embodiment of the inventive concept, because the dummy structure 200 is inserted in the wiring substrate 100 to face the bridge chip 300 with the core portion 110 interposed therebetween, it may be possible to reduce a difference in thermal expansion coefficient between the upper and lower portions of the wiring substrate 100. Furthermore, it may be possible to realize a wiring substrate with improved structural stability and a semiconductor package including the same.

According to various embodiments of the inventive concept, a wiring substrate may include a core portion having a top surface, a bottom surface, and a thickness therebetween. In various embodiments, an upper peripheral portion may be provided on the top surface of the core portion, and a lower peripheral portion may be provided on the bottom surface of the core portion. The core portion may include a penetration via extending from the top surface through the core portion to the bottom surface, and electrically connecting the upper peripheral portion to the lower peripheral portion. The upper peripheral portion may include a bridge chip provided on the top surface of the core portion, upper insulating patterns provided on the top surface of the core portion and covering the bridge chip, and upper interconnection patterns in the upper insulating patterns. The lower peripheral portion may include a dummy structure provided on the bottom surface of the core portion, lower insulating patterns provided on the bottom surface of the core portion and covering the dummy structure, and lower interconnection patterns in the lower insulating patterns. A mean thermal expansion coefficient of the upper peripheral portion may be substantially equal to a mean thermal expansion coefficient of the lower peripheral portion. The lower peripheral portion 120 may be a first redistribution layer. The upper peripheral portion 130 may be a second redistribution layer.

In a wiring substrate, according to an embodiment of the inventive concept, and a semiconductor package including the same, a bridge chip may be inserted in a wiring substrate to electrically connect a plurality of semiconductor chips or a plurality of external devices on the wiring substrate. Here, a dummy structure may be inserted in a lower peripheral portion of the wiring substrate to reduce a difference in a mean thermal expansion coefficient between the upper and lower peripheral portions of the wiring substrate. A mean thermal expansion coefficient of the upper peripheral portion can be sufficiently equal to a mean thermal expansion coefficient of the lower peripheral portion to reduce or prevent the wiring substrate from warping. As a result, it may be possible to reduce or prevent the wiring substrate from warping, which may occur when the upper and lower peripheral portions of the wiring substrate have different thermal expansion coefficients, and thereby to improve the structural stability of the wiring substrate.

While example embodiments of the inventive concept have been particularly shown and described, it will be understood by one of ordinary skill in the art that variations in form and detail may be made therein without departing from the spirit and scope of the inventive concept and attached claims.

What is claimed is:

1. A wiring substrate, comprising:

a core portion;

an upper peripheral portion provided on a top surface of the core portion; and a lower peripheral portion provided on a bottom surface of the core portion, wherein the core portion comprises a penetration via vertically penetrating the core portion and electrically connecting the upper peripheral portion to the lower peripheral portion, wherein the upper peripheral portion comprises:

a bridge chip provided on the top surface of the core portion;

upper insulating patterns provided on the top surface of the core portion and covering the bridge chip; and upper interconnection patterns in the upper insulating patterns, wherein the lower peripheral portion comprises:

a dummy structure provided on the bottom surface of the core portion;

lower insulating patterns provided on the bottom surface of the core portion and covering the dummy structure; and lower interconnection patterns in the lower insulating patterns, wherein a mean thermal expansion coefficient of the upper peripheral portion is substantially equal to a mean thermal expansion coefficient of the lower peripheral portion.

2. The wiring substrate of claim 1, wherein a thermal expansion coefficient of the dummy structure is between 0.9 and 1.1 times a thermal expansion coefficient of the bridge chip.

3. The wiring substrate of claim 2, wherein the thermal expansion coefficient of the bridge chip is substantially equal to the thermal expansion coefficient of the dummy structure.

4. The wiring substrate of claim 1, wherein a main material of the bridge chip is substantially the same as a main material of the dummy structure.

5. The wiring substrate of claim 1, wherein the bridge chip and the dummy structure have substantially the same shape.

6. The wiring substrate of claim 1, wherein a side surface of the bridge chip and a side surface of the dummy structure are aligned with each other in a direction perpendicular to the top surface of the core portion.

7. The wiring substrate of claim 1, wherein the bridge chip overlaps with the dummy structure.

8. The wiring substrate of claim 1, further comprising a first adhesive layer attaching the bridge chip to the top surface of the core portion.

9. The wiring substrate of claim 1, further comprising a second adhesive layer attaching the dummy structure to the bottom surface of the core portion.

10. The wiring substrate of claim 1, wherein the penetration via is shifted from the bridge chip in a direction parallel to the top surface of the core portion.

11. A wiring substrate, comprising:

a first redistribution layer;

a second redistribution layer provided on the first redistribution layer;

a core portion disposed between the first redistribution layer and the second redistribution layer, the core portion comprising a center region and peripheral regions enclosing the center region;

a dummy chip provided on the center region of the core portion and in the first redistribution layer; and a bridge chip provided on the center region of the core portion and in the second redistribution layer, wherein a thermal expansion coefficient of the dummy chip is between 0.9 and 1.1 times a thermal expansion coefficient of the bridge chip.

12. The wiring substrate of claim 11, further comprising a penetration via in the peripheral regions of the core portion that penetrate the core portion and electrically connects the first redistribution layer to the second redistribution layer.

13. The wiring substrate of claim 11, wherein the bridge chip comprises:

a bridge substrate; and a bridge interconnection layer on a top surface of the bridge substrate, wherein the bridge interconnection layer comprises bridge circuit patterns.

14. The wiring substrate of claim 11, further comprising a first adhesive layer attaching the bridge chip to a top surface of the core portion.

15. The wiring substrate of claim 11, further comprising a second adhesive layer attaching the dummy chip to a bottom surface of the core portion.

16. The wiring substrate of claim 11, wherein the first redistribution layer comprises:

first substrate insulating patterns covering a bottom surface of the core portion; and first interconnection patterns in the first substrate insulating patterns, wherein the second redistribution layer comprises:

second substrate insulating patterns covering a top surface of the core portion; and second interconnection patterns in the second substrate insulating patterns.

17. The wiring substrate of claim 16, wherein, on the top surface of the core portion, the second substrate insulating patterns cover the bridge chip, and the second interconnection patterns are electrically connected to circuit patterns of the bridge chip.

18. The wiring substrate of claim 16, wherein, in the first substrate insulating patterns, the dummy chip and the first substrate interconnection patterns are horizontally spaced apart from each other, and the dummy chip is in an electrically floated state.

19. The wiring substrate of claim 16, wherein, on the bottom surface of the core portion, the first substrate insulating pattern covers the dummy chip.

20. A semiconductor package, comprising:

a package substrate;

a first semiconductor chip on the package substrate;

a chip stack provided on the package substrate, wherein the chip stack is laterally spaced apart from the first semiconductor chip, wherein the chip stack comprising a plurality of second semiconductor chips that are vertically stacked; and a mold layer provided on the substrate to enclose the first semiconductor chip and the chip stack, wherein the package substrate comprises:

a core portion;

a bridge chip provided on a top surface of the core portion;

an upper peripheral portion covering the top surface of the core portion and the bridge chip;

a dummy structure provided on a bottom surface of the core portion; and a lower peripheral portion covering the bottom surface of the core portion and the dummy structure, wherein a material of the bridge chip is substantially the same as a material of the dummy structure, and the bridge chip and the dummy structure overlap each other.

* * * * *